(12) United States Patent
Wu et al.

(10) Patent No.: US 7,659,163 B2
(45) Date of Patent: Feb. 9, 2010

(54) SEMICONDUCTOR DEVICES HAVING RECESSED STRUCTURES AND METHODS OF FORMING THE SAME

(75) Inventors: Chih-Huang Wu, Taipei (TW); Chien-Jung Yang, Taipei (TW)

(73) Assignee: Nanya Technology Corp., Taoyuan (TW)

( * ) Notice: Subject to any disclaimer, the term of this patent is extended or adjusted under 35 U.S.C. 154(b) by 223 days.

(21) Appl. No.: 11/564,929

(22) Filed: Nov. 30, 2006

(65) Prior Publication Data
US 2007/0178647 A1 Aug. 2, 2007

(30) Foreign Application Priority Data
Jan. 27, 2006 (TW) .............................. 95103669 A

(51) Int. Cl.
*H01L 21/8242* (2006.01)
(52) U.S. Cl. ............... 438/243; 438/386; 257/E27.092; 257/E21.396

(58) Field of Classification Search ................. 438/142, 438/197, 243, 244, 270, 386, 387; 257/E27.092, 257/E27.095, E29.346, E21.396
See application file for complete search history.

(56) References Cited

U.S. PATENT DOCUMENTS

| 7,005,698 B2 * | 2/2006 | Lin et al. ..................... 257/315 |
| 2006/0270176 A1 * | 11/2006 | Lee et al. ..................... 438/386 |

\* cited by examiner

*Primary Examiner*—Brook Kebede
(74) *Attorney, Agent, or Firm*—Ingrassia Fisher & Lorenz, P.C.

(57) ABSTRACT

A method for forming a semiconductor device is provided. The method includes providing a substrate having a plurality of protrusions projecting from the substrate; forming a silicon layer over the substrate and each protrusion; performing an anisotropic etching to transfer the silicon layer into a silicon spacer positioned on a side wall of each protrusion; forming an oxide layer over the silicon spacer; and etching the substrate to form a recess on the substrate by using the oxide layer as a mask.

20 Claims, 13 Drawing Sheets

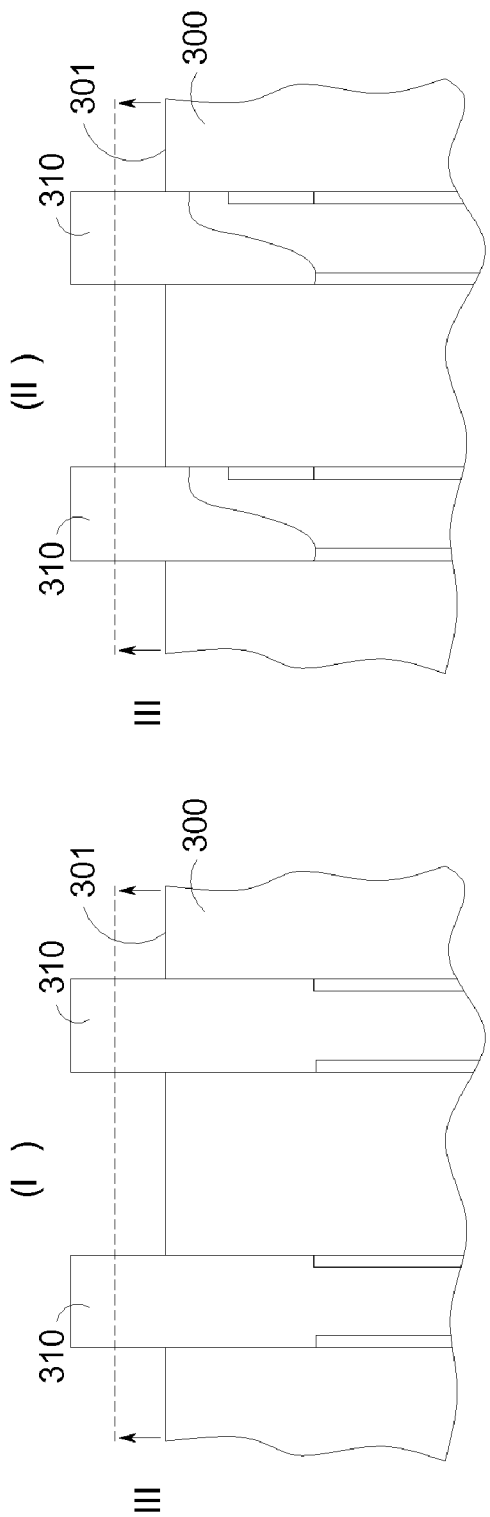
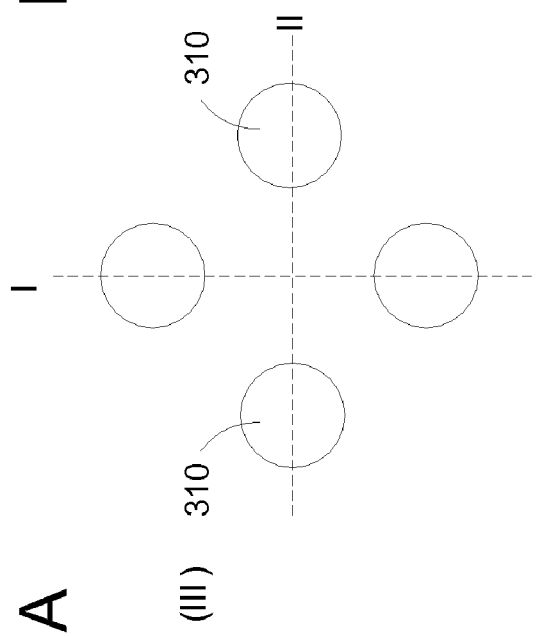
FIG.4A  FIG.4B  FIG.4C

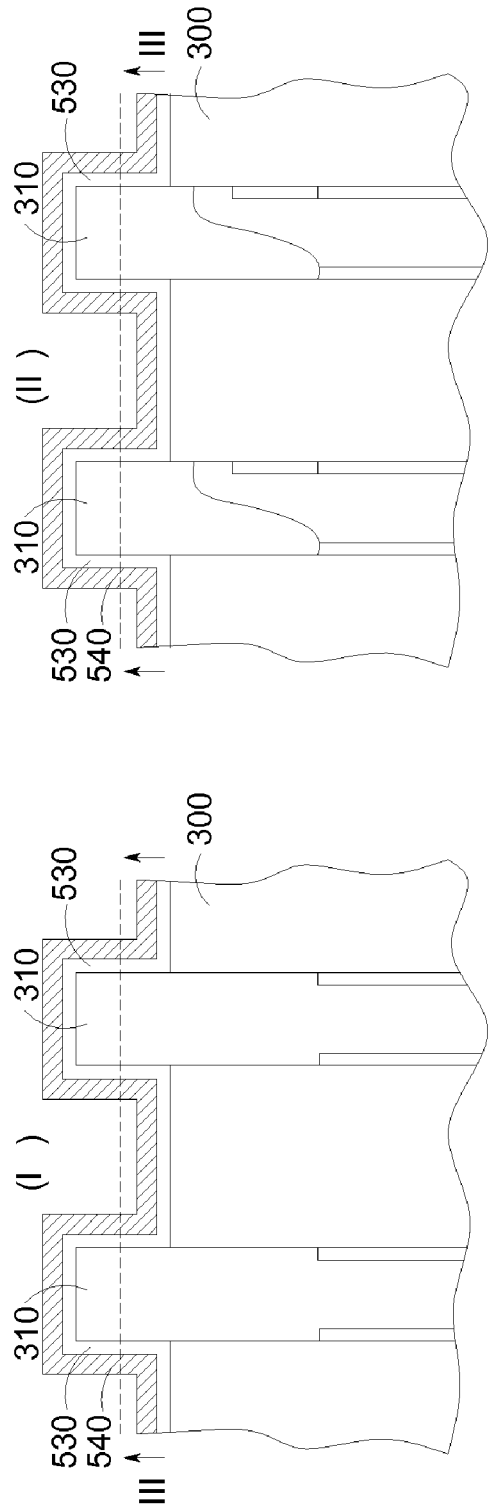
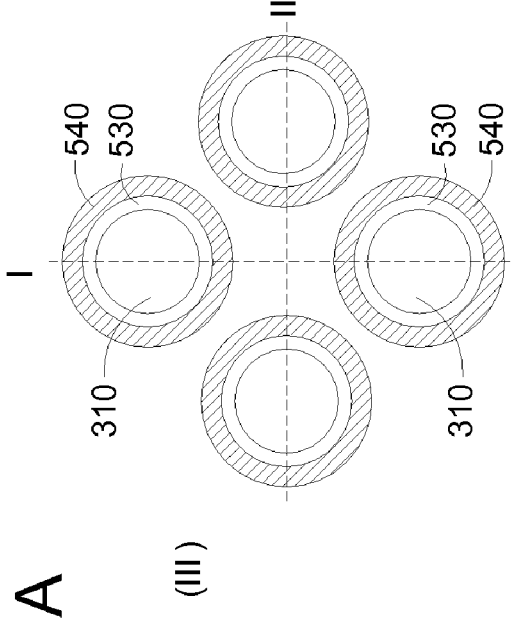
FIG.5A
FIG.5B
FIG.5C

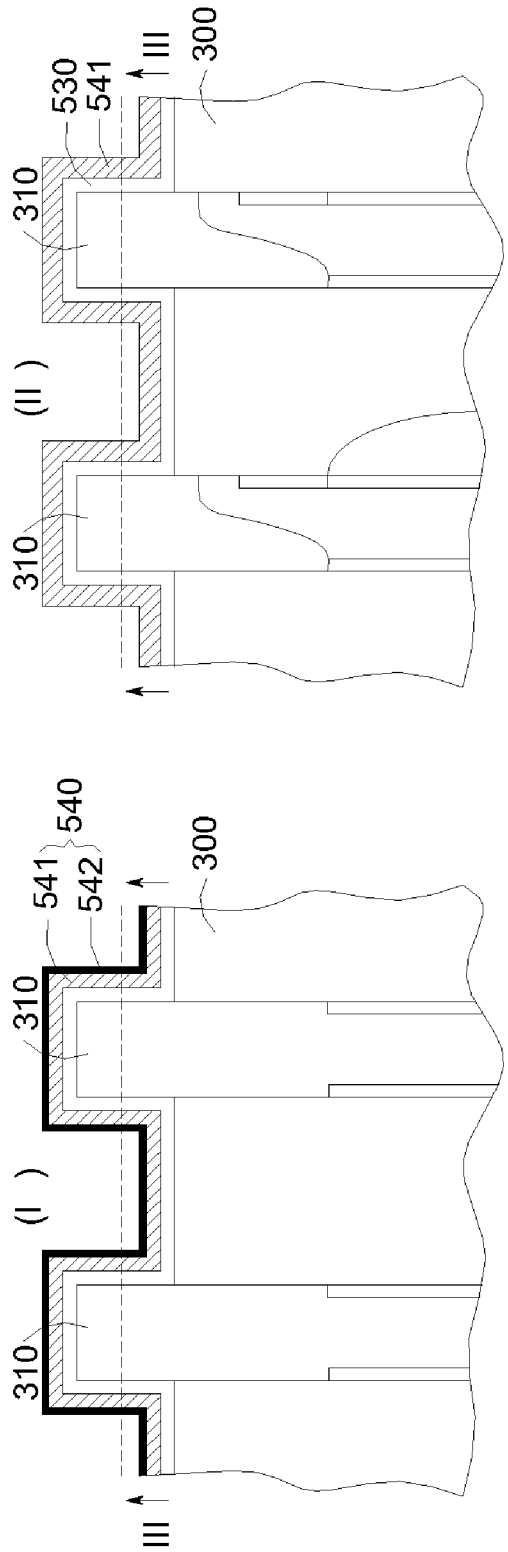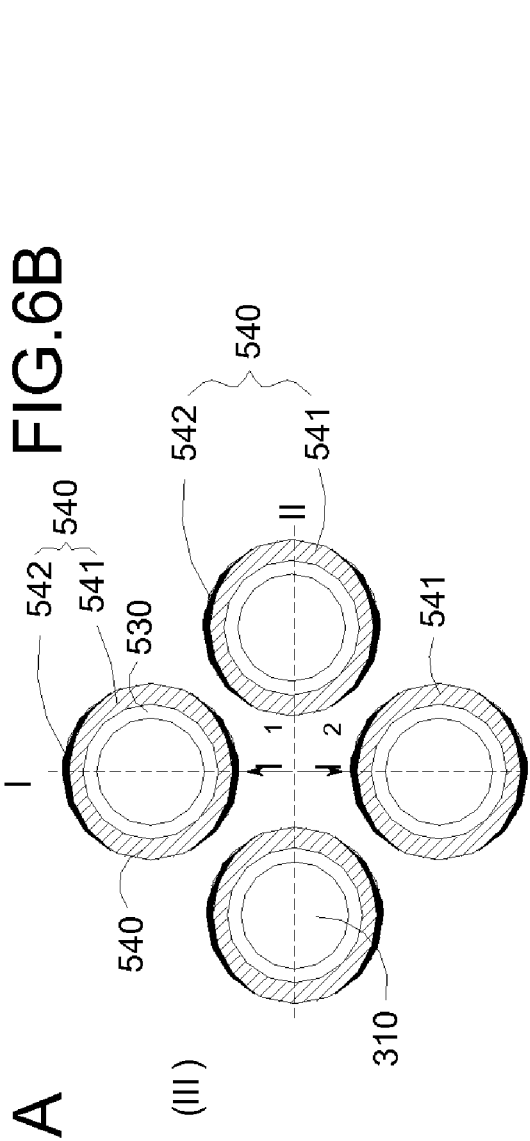

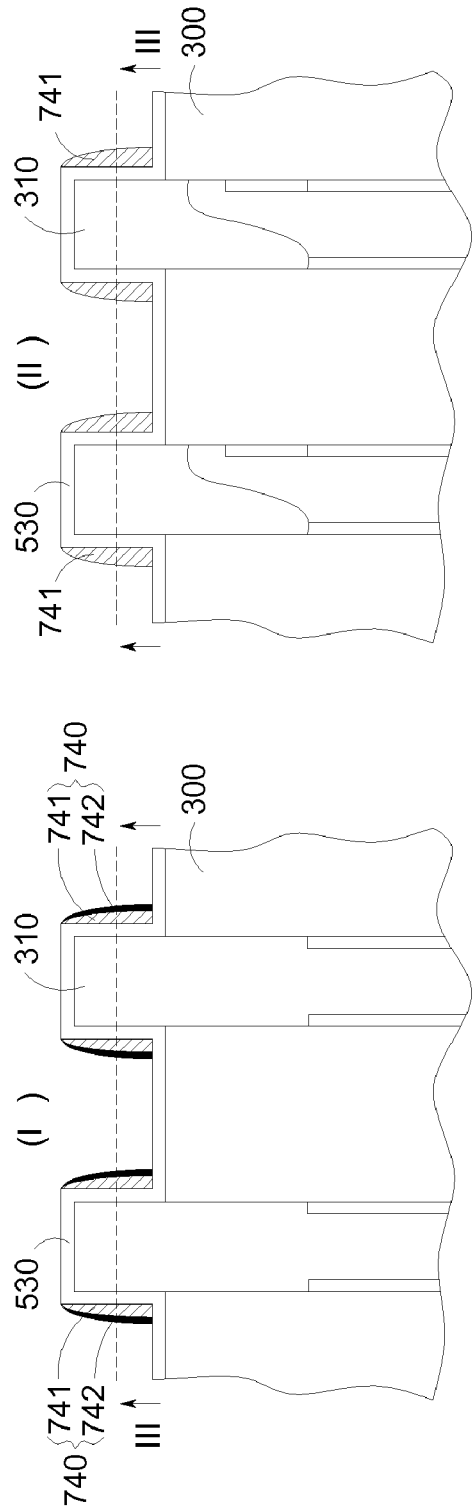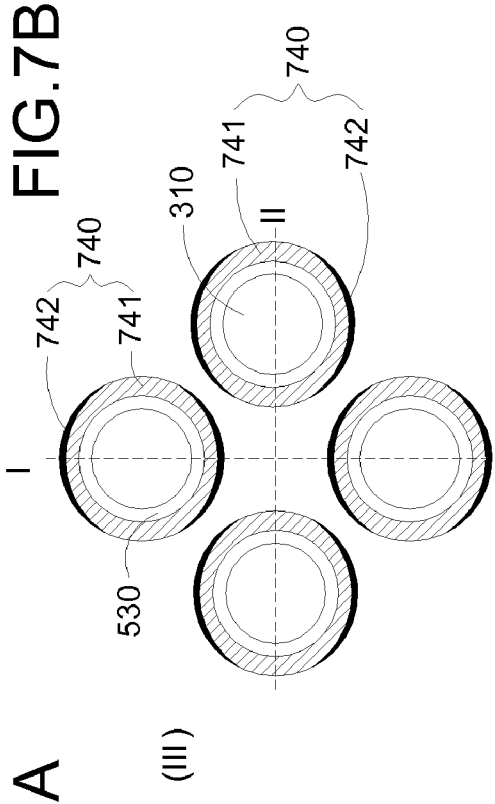

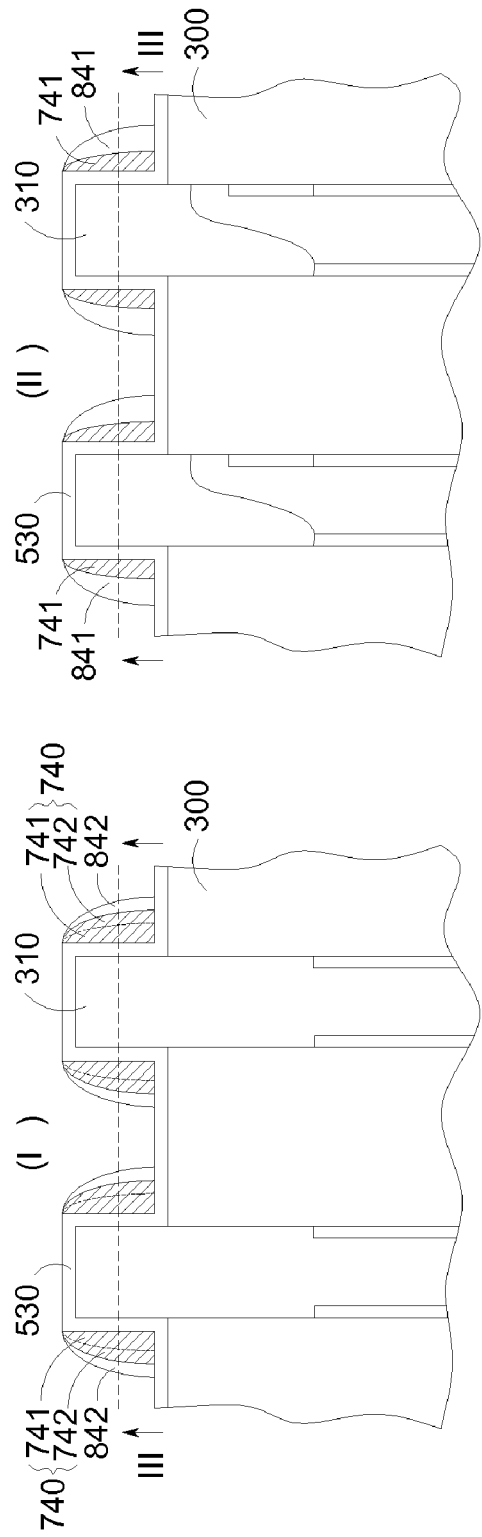
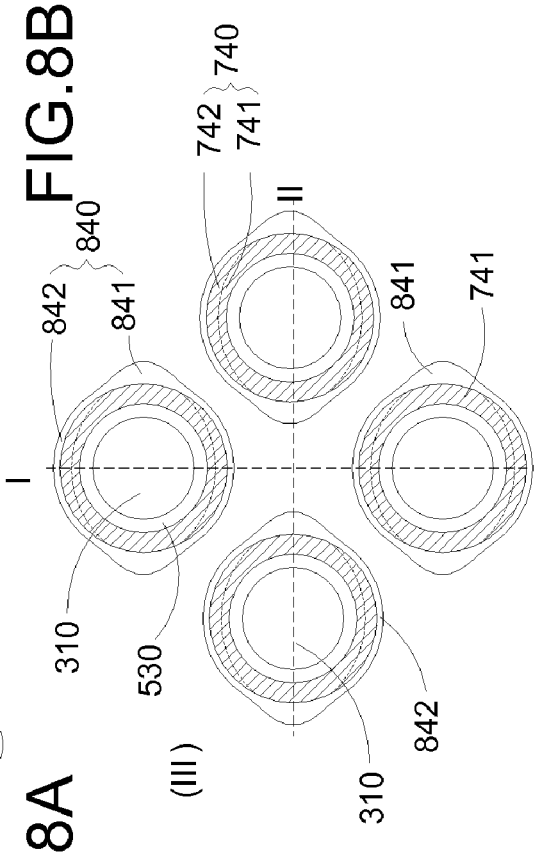
FIG.8A
FIG.8B
FIG.8C

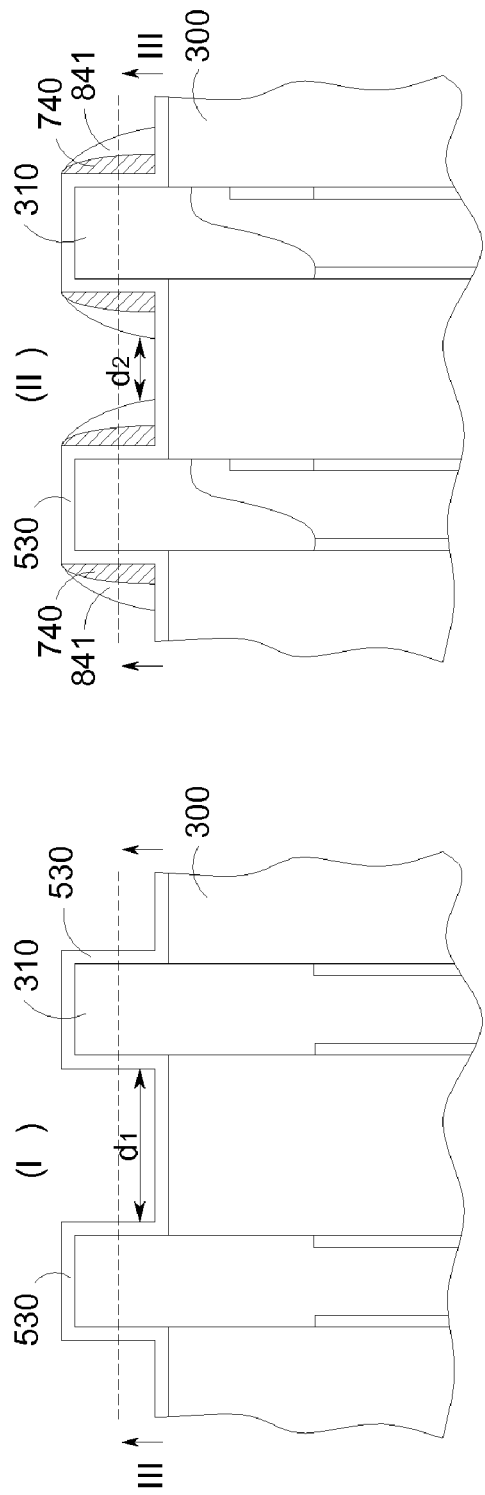
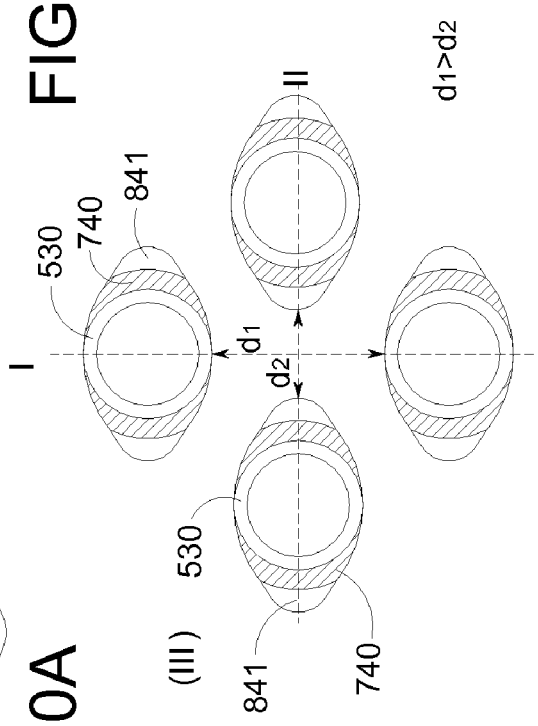
FIG.10A
FIG.10B
FIG.10C

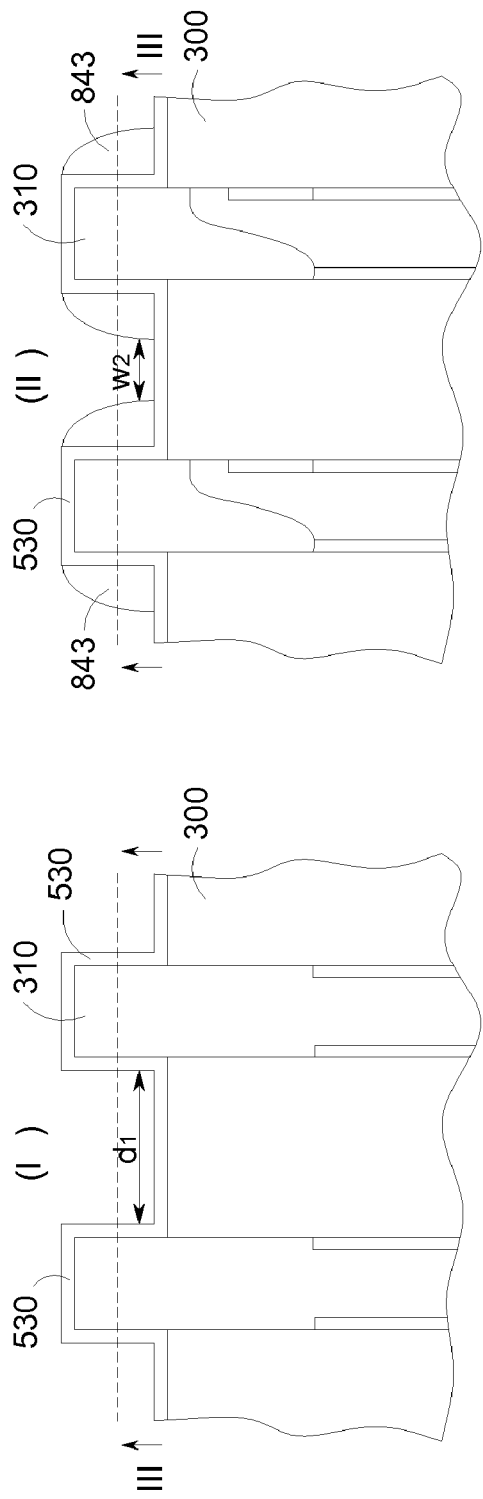
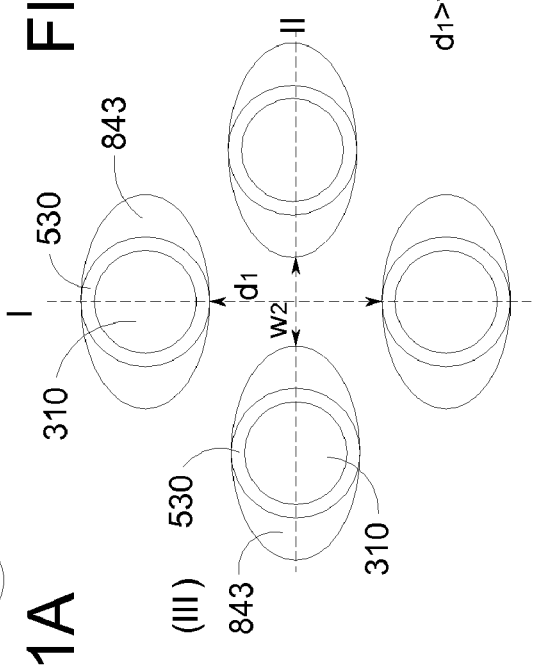
FIG.11A
FIG.11B
FIG.11C

SEMICONDUCTOR DEVICES HAVING RECESSED STRUCTURES AND METHODS OF FORMING THE SAME

FIELD OF INVENTION

The present invention generally relates to a method of forming a semiconductor device, and more particularly, to a method of forming a semiconductor device having a recessed channel.

BACKGROUND OF THE INVENTION

In the recent development, a recessed channel has been provided with the intention of alleviating short channel effects in Metal Oxide Semiconductor Field Effect Transistors (MOSFETs). FIG. 1 illustrates the formation of the recessed channel in the MOSFET, in which a patterned mask 110 is lithographically formed on a Si substrate 100, and then an etching step is performed to create the recessed structure on the substrate 100. However, as the device dimension continuously shrinks, the process window becomes more and more narrow or critical, which poses more difficulties while forming the patterned mask by lithography process. Therefore, it would be desirable to provide an improved method to resolve the above-described problem.

SUMMARY OF THE INVENTION

One aspect of the present invention is to provide a method of forming a recessed structure without implementing extra lithography processes.

In one embodiment, the present invention provides a method of forming a semiconductor device, comprising providing a substrate including a plurality of protrusions projecting from the substrate, each protrusion separated from each other; forming a silicon layer above the substrate and each protrusion; performing an anisotropic etching to remove a portion of the silicon layer and remain another portion of the silicon layer positioned on a sidewall of each protrusion, so as to transform the silicon layer into a silicon spacer; forming a oxide layer over said the silicon spacer; and etching the substrate by using the oxide layer as a mask to form a recess on the substrate.

Another aspect of the present invention is to provide a method of forming a recessed structure without implementing extra lithography processes. This method renders a broader process window, which is beneficial for forming other components in the subsequent processes.

In one embodiment, the present invention provides a method of forming a semiconductor device, comprising providing a substrate including at least four protrusions projecting from the substrate, the at least four protrusions being arranged as a quadrangle to define a diagonal direction; forming a silicon layer above the substrate and each protrusion; performing an ion implanting along the diagonal direction to form an implanted region and a non-implanted region in the silicon layer; performing an anisotropic etching to transform the silicon layer into a silicon spacer positioned on a sidewall of each protrusion; forming a first oxide layer over the non-implanted region in the silicon spacer and a second oxide layer over the implanted region in the silicon spacer, the first oxide layer being thicker than the second oxide layer; etching the second oxide layer; and etching the substrate by using the first oxide layer as a mask to form a recess on the substrate.

BRIEF DESCRIPTION OF THE DRAWINGS

FIGS. 4A to 11A are cross-sectional views along a first diagonal line I illustrating the formation of a semiconductor device in accordance with the second embodiment of the present invention.

FIGS. 4B to 11B are cross-sectional views along a second diagonal line II illustrating the formation of a semiconductor device in accordance with the second embodiment of the present invention.

FIGS. 4C to 11C are cross-sectional views along a dotted line III illustrating the formation of a semiconductor device in accordance with the second embodiment of the present invention.

DETAILED DESCRIPTION OF THE INVENTION

Figure 1:
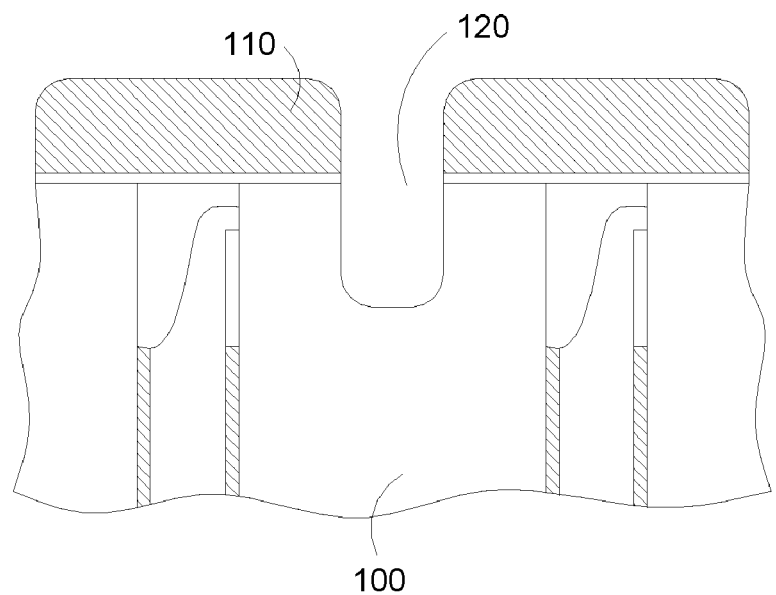
FIG. 1 illustrates a cross-sectional view of a semiconductor device in accordance with a conventional method.

The preferred embodiments of the present invention will now be described in greater details by referring to the drawings that accompany the present application. It should be noted that the features illustrated in the drawings are not necessarily drawn to scale. Descriptions of well-known components, materials, and process techniques are omitted so as to not unnecessarily obscure the embodiments of the invention.

Figure 2A:
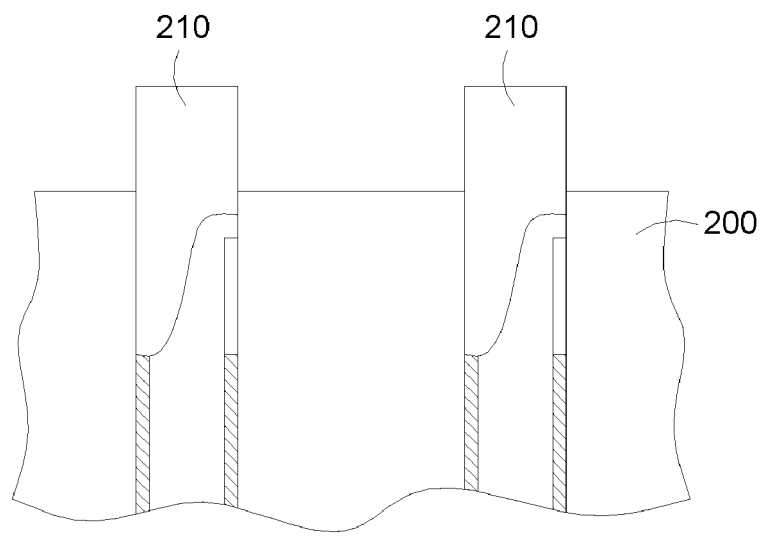
FIGS. 2A to 2E are cross-sectional views illustrating the formation of a semiconductor device in accordance with a first embodiment of the present invention.

Referring now to FIGS. 2A to 2E illustrating the first embodiment of the present invention. As shown in FIG. 2A, the first embodiment starts by providing a substrate 200, which may be made from any well-known silicon wafers or any other compatible semiconductor materials. In addition, there are a plurality of protrusions 210 projecting from the substrate 200, in which each protrusion 210 are isolated from each other by a distance. The protrusion 210 includes a dielectric isolation region. The dielectric isolation region may be composed of a dielectric material such as an oxide, nitride, oxynitride, or any combination thereof. Further, a buried component, for example, a trench capacitor, may be provided underneath the protrusion 210 (not shown).

Figure 2B:
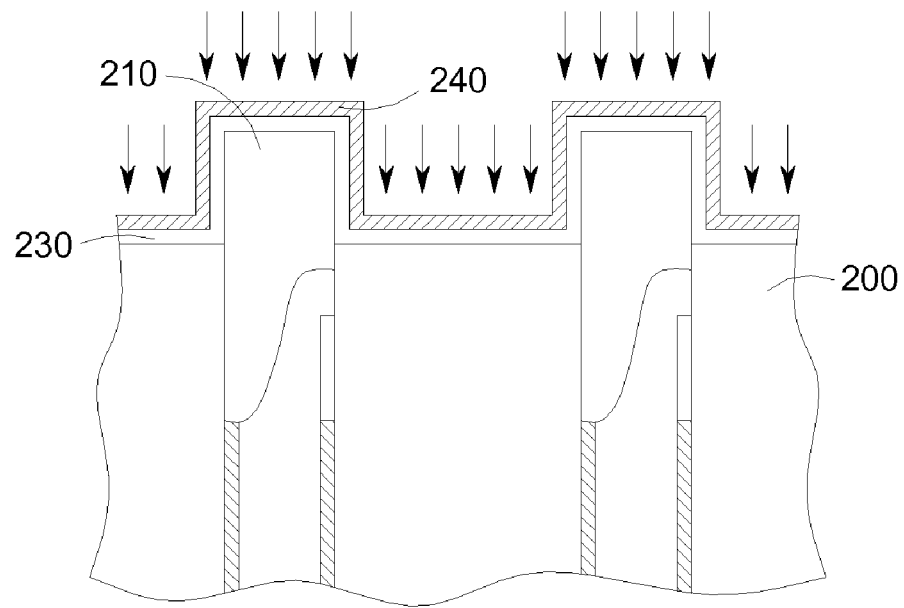
Figure 2C:
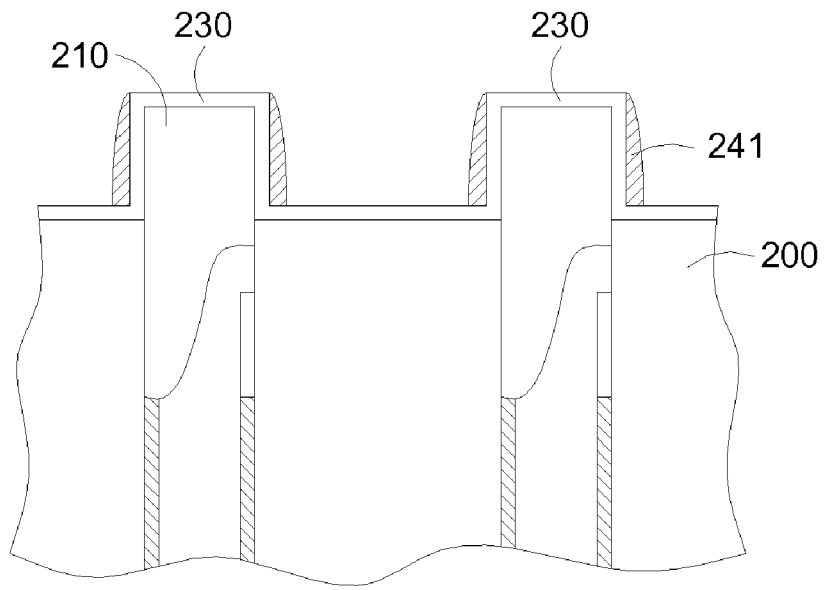

Next, as shown in FIG. 2B, a pad layer 230, typically made of silicon nitride, and a silicon layer 240 are conformally deposited above the substrate 200 and each protrusion 210. Any conformal disposition process including, for example, chemical vapor deposition (CVD), plasma enhanced chemical vapor deposition (PECVD), chemical solution deposition, evaporation, atomic layer deposition (ALD) and other like deposition processes may be utilized. The silicon layer 240 is either polysilicon or amorphous silicon while the latter is preferred. Then, as shown in FIGS. 2B-2C, an anisotropic etching is performed, preferably through a dry etching, in order to remove a portion of the silicon layer 240 and remain the portion of the silicon later 240 positioned on a sidewall of each protrusion 210. Consequently, after this anisotropic etching step, the silicon layer 240 is transformed into a silicon spacer 241 on the sidewall of each protrusion 210.

Figure 2D:
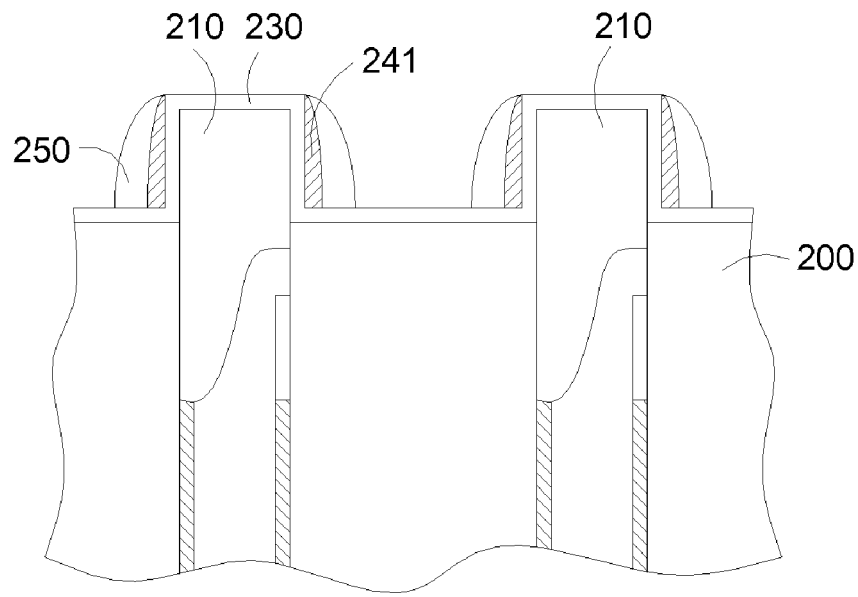
Figure 2E:
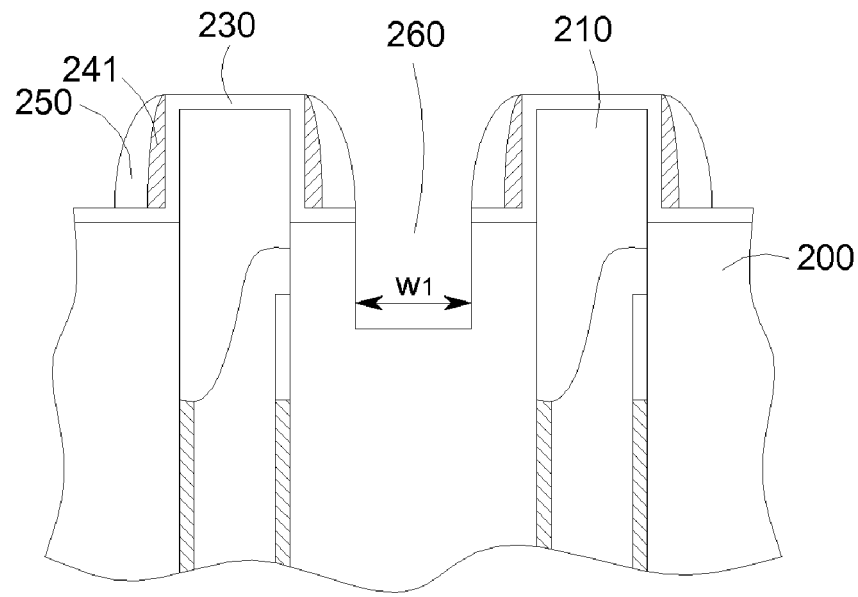

Then, as shown in FIG. 2D, an oxide layer 250 is formed over the silicon spacer 241. The formation of the oxide layer 250 may be through a thermal oxidization, by which silicon on the surface of the silicon spacer 241 is transferred into silicon oxide. Then, as shown in FIG. 2E, etching the substrate 200 utilizing the oxide layer 250 as a mask forms a recessed structure 260. The recessed structure 260 is provided for, illustratively, forming a recessed channel in subsequent steps for the semiconductor device.

It should be noted that the width $w_1$ of the recessed structure 260 shown in FIG. 2E is adjustable by controlling the thickness of the mask, i.e. the oxide layer 250. Further, the thickness of the oxide layer 250 depends on the thickness of the silicon spacer 241 being deposited prior to the oxidation step as well as the extent of the silicon spacer 241 being oxidized. In other words, if a broader width $w_1$ is desired, each oxide layer 250 acting as the mask should be further away from each other, which can be achieved by initially depositing a thinner silicon spacer 241 or carefully controlling the oxidization so as to form the oxide layer 250 of the adequate and limited thickness. On the other hand, if the narrow width $w_1$ is desired, each oxide layer 250 acting as the mask should be closer to each other, which may be achieved by initially depositing a thicker silicon spacer 241, or increasing the oxidization extent of the silicon spacer 241. The latter will make more silicon transfer into silicon oxide and thus the oxide spacer 250 becomes much thicker because the density of silicon oxide is greater than that of the silicon. In addition, the entire silicon spacer 241 may be completely oxidized to form a substantially thickest oxide layer 250, which is also intended to be an embodiment of the present invention.

Therefore, it should be understood that a recessed structure of a semiconductor device is formed without implementing extra lithography processes in accordance with the first embodiment of the present invention.

Figure 3:
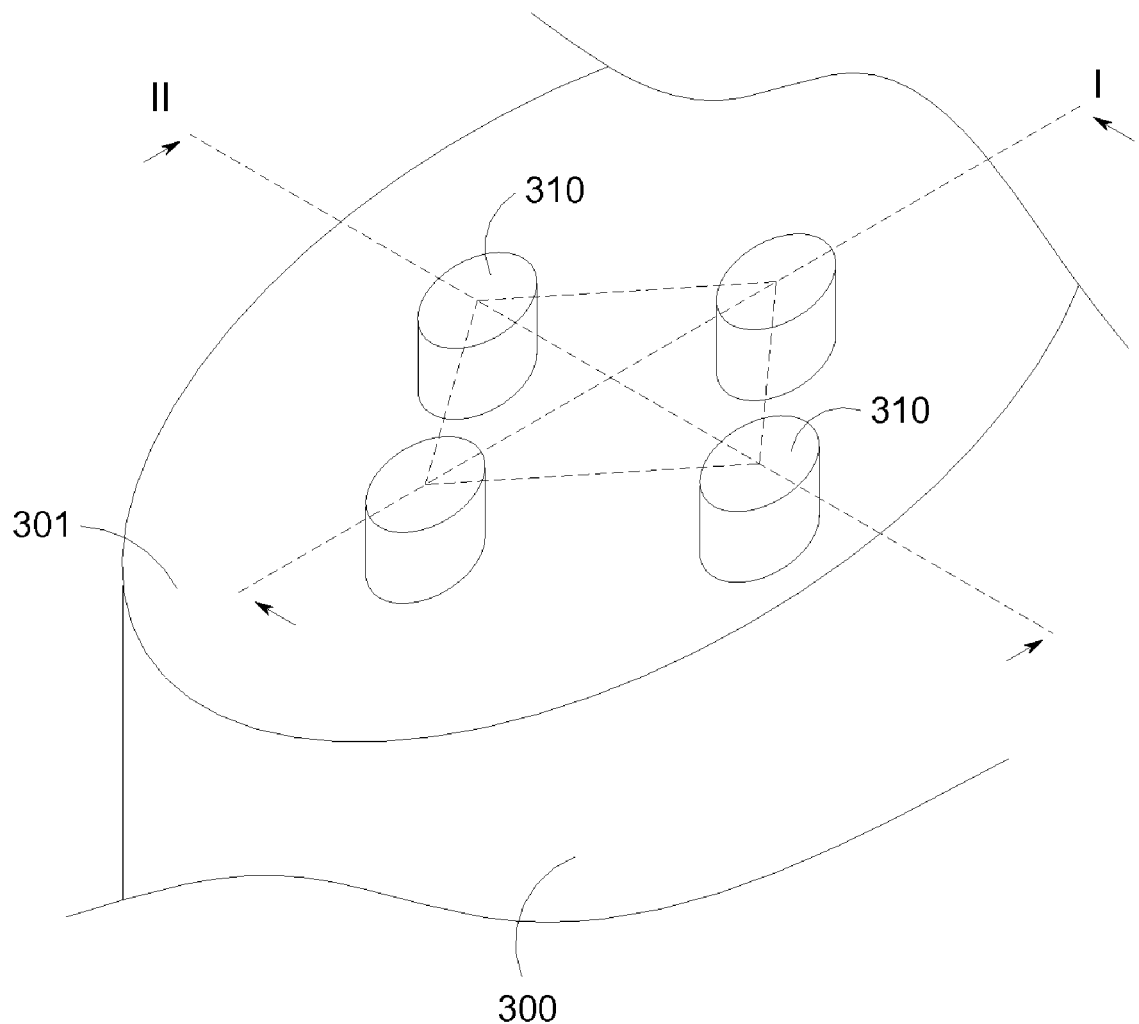
FIG. 3 is a perspective view of a substrate in accordance with a second embodiment of the present invention.

The second embodiment of the present invention will now be described in greater details as below. As shown in FIG. 3, the second embodiment starts by providing a substrate 300, which may be made from any well-known silicon wafers or any other compatible semiconductor materials. There are at least four protrusions 310 projecting from the surface 301 of the substrate 300. The number of protrusions 310 shown in FIG. 3 is for illustration rather than limitation.

Referring to FIG. 3, the at least four protrusions are arranged as a quadrangle on the substrate so as to define a first diagonal line I and a second diagonal line II. FIG. 4A is a cross-sectional view along the first diagonal line I. Thus, it should be understood that FIGS. 4A to 11A are cross-sectional views along the first diagonal line I respectively illustrating the processing steps employed in the second embodiment. Similarly, FIGS. 4B to 11B are cross-sectional views along the second diagonal line II, and FIGS. 4C to 11C are cross-sectional views along the dotted line III in FIGS. 4A and 4B.

Referring to FIGS. 4A and 4B, the protrusion 310 includes a dielectric isolation region, which is composed of a dielectric material such as oxide, nitride, oxynitride, or any combination thereof. In addition, a buried device, for example, a trench capacitor, may be provided underneath the protrusion 310 (not shown).

Next, as shown in FIGS. 5A, 5B, and 5C, a pad layer 530, typically made of silicon nitride, and a silicon layer 540 are conformally deposited above the substrate 300 and the protrusion 310. Any conformal disposition process including, for example, chemical vapor deposition (CVD), plasma enhanced chemical vapor deposition (PECVD), chemical solution deposition, evaporation, atomic layer deposition (ALD) and other like deposition processes may be utilized in this step. The silicon layer 540 is either polysilicon or amorphous silicon while the latter is preferred.

Next, referring to FIGS. 6A, 6B, and 6C, an implanted region 542 is obtained by performing an ion implantation into a portion of the silicon layer 540 along the first diagonal line I. The arrows $I_1$ and $I_2$ shown in FIG. 6C denote two opposite directions along the first diagonal line I. In the second embodiment, the ion implanting is performed along both of the direction $I_1$ and $I_2$ as well as using nitrogen as the preferred ion source. Because the ion implanting is employed along the first diagonal line I, the implanted region 542 is obtained on the portion of the silicon layer 540 toward to the directions $I_1$ and $I_2$, as shown in FIGS. 6A and 6C. The other portion of the silicon layer 540 toward the direction of second diagonal line II not being subjected by the ion implanting is referred as a non-implanted region 541.

Then, an anisotropic etching is performed, preferably by a dry etching, to transform the silicon layer 540, including the implanted region 542 and the non-implanted region 541, into a silicon spacer 740 on a sidewall of each protrusion 310. It should be understood that the silicon spacer 740 contains a non-implanted region 741 and an implanted region 742.

Next, as shown in FIGS. 8A, 8B, and 8C, an oxide layer 840 is formed over the silicon spacer 740, in which the oxide layer 840 on the non-implanted region 741 is referred as a first oxide layer 841 while the oxide layer 840 on the implanted region 742 is referred as a second oxide layer 842. The second oxide layer 842 is thinner than the first oxide layer 841 due to the implanted ions within the implanted region 742.

Next, the second oxide layer 842 is removed by etching step, preferably through a DHF wet etching. It should be noted that the first oxide layer 841 may be removed at the same time when this wet etching is performed. However, since the first oxide layer 841 is thicker than the second oxide layer 842 as previously mentioned, a portion of the first oxide layer 841 still remain on the silicon spacer 740 after the second oxide layer 842 is substantially completely removed. The resultant structure following this step is illustrated by FIGS. 9A, 9B, and 9C.

Figure 9A:
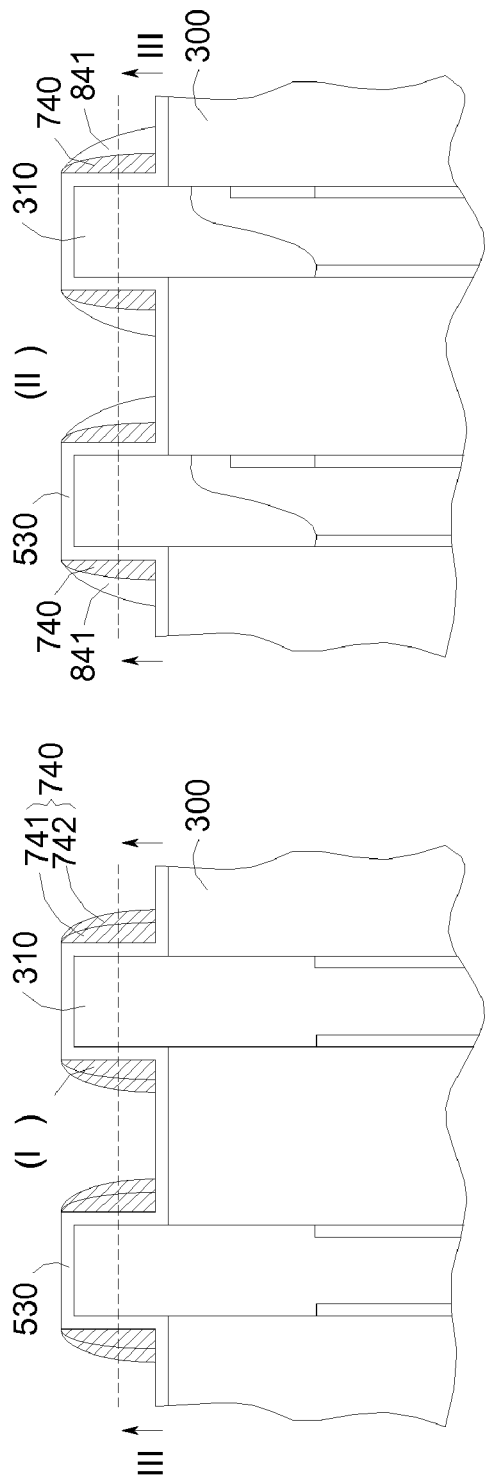
Figure 9B:
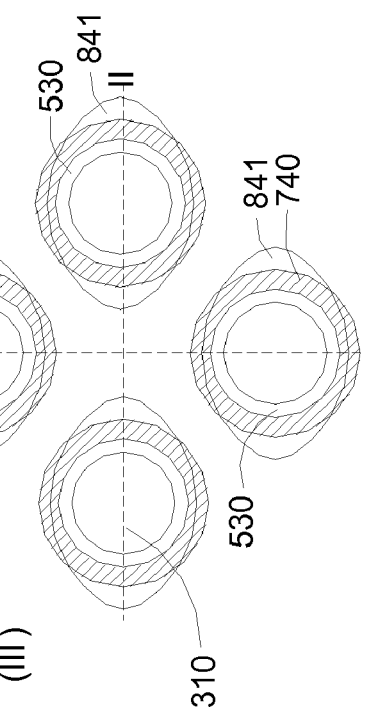
Figure 9C:
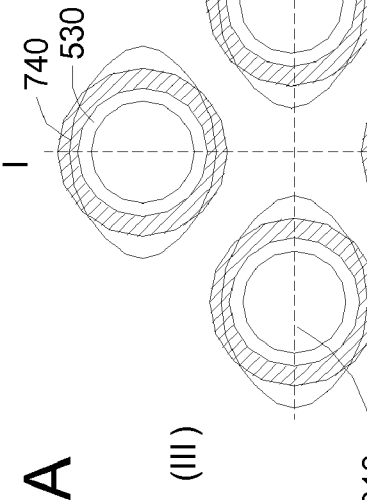

Then, the exposed silicon spacer 740 shown in FIGS. 9A, 9B, and 9C are selectively removed by another etching step, preferably through a NH$_4$OH wet etching. It should be noted that this selective etching step doesn't remove the silicon spacer 740 covered by the first oxide layer 841. The resultant structure following this step is illustrated by FIGS. 10A, 10B, and 10C, in which the first oxide layer 841 along the second diagonal line II is provided to act as a mask for forming a recessed channel in the subsequent processes.

FIG. 10C illustrates the resultant structure after the above-described steps are employed, wherein the distance $d_1$ between each protrusion 310 along the diagonal line I is greater than the distance $d_2$ between each protrusion 310 along the diagonal line II. Therefore, it should be understood that the present invention provides a broader process window (the distance $d_1$) along the direction of the diagonal line I for forming the other components in the semiconductor device.

FIGS. 11A, 11B, and 11C illustrate an optional oxidation process in the present invention. Oxidizing substantially all silicon spacer 740 forms the third oxide layer 843. As aforementioned, it should be understood that the third oxide layer 843 is thicker than the first oxide layer 841.

Figure 12:
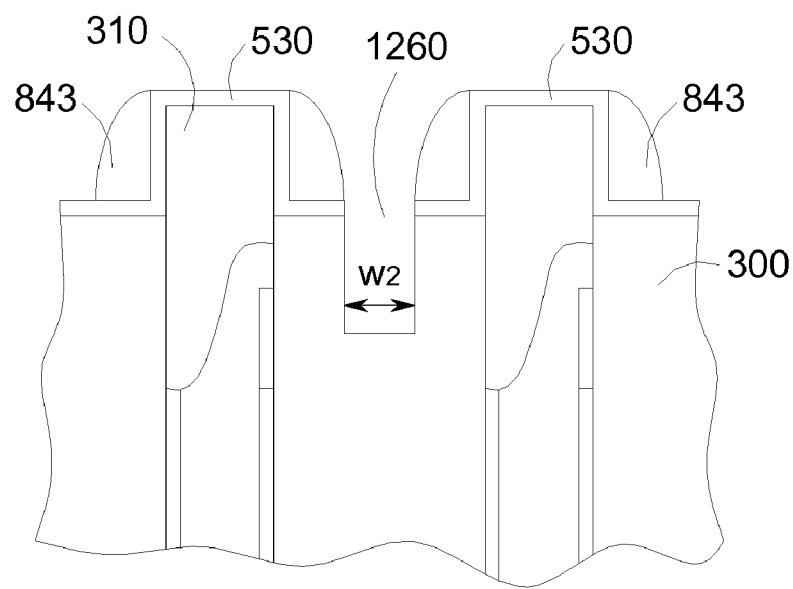
FIG. 12 illustrates a cross-sectional view of a recessed structure in a semiconductor device in accordance with the second embodiment of the present invention.

FIG. 12 illustrates a recessed structure 1260 formed by etching the substrate 300 utilizing the third oxide layer 843 as a mask. The recessed structure is provided for, illustratively, forming a recessed channel in the subsequent processes. As the description in the first embodiment, the width $w_2$ of the recessed structure 1260 is adjustable by controlling the thickness of the mask, i.e. the third oxide layer 843. Further, the thickness of the third oxide layer 843 depends on the thickness of the silicon spacer 740 being deposited prior to oxidation as well as the oxidation extent of the silicon spacer 740.

Although specific embodiments have been illustrated and described, it will be obvious to those skilled in the art that various modifications may be made without departing from what is intended to be limited solely by the appended claims.

What is claimed is:

1. A method of forming a semiconductor device, comprising:
    providing a substrate including at least four protrusions projecting from said substrate, said at least four protrusions being arranged as a quadrangle to define a diagonal direction;
    forming a silicon layer above said substrate and each protrusion;
    performing an ion implanting along said diagonal direction to form an implanted region and a non-implanted region in said silicon layer;
    performing an anisotropic etching to transform said silicon layer into a silicon spacer positioned on a side wall of each protrusion;
    forming a first oxide layer over said non-implanted region in said silicon spacer and a second oxide layer over said implanted region in said silicon spacer, said first oxide layer being thicker than said second oxide layer;
    etching said second oxide layer; and
    etching said substrate by using said first oxide layer as a mask to form a recess in said substrate.

2. The method of claim 1, further comprising forming a pad layer over said substrate and each protrusion.

3. The method of claim 1, wherein said step of ion implanting further comprises providing a nitrogen ion source.

4. The method of claim 1, wherein said protrusion comprises a dielectric isolation region.

5. The method of claim 1, wherein said step of etching said second oxide layer is performed by a wet etching.

6. The method of claim 1, further comprising removing said silicon spacer covered by said second oxide layer.

7. The method of claim 6, where said step of removing said silicon spacer covered by said second oxide layer is performed by a wet etching.

8. The method of claim 1, further comprising oxidizing substantially all silicon spacers.

9. The method of claim 1, wherein said substrate further comprises a trench capacitor underneath said protrusion.

10. A method of forming a semiconductor device, comprising:
    providing a substrate including at least four protrusions projecting from said substrate, said at least four protrusions being arranged as a quadrangle to define a diagonal direction;
    forming a silicon layer above said substrate and each protrusion;
    performing an ion implanting along said diagonal direction to form an implanted region and a non-implanted region in said silicon layer;
    performing an anisotropic etching to transform said silicon layer into a silicon spacer positioned on a side wall of each protrusion;
    forming an oxide layer over said silicon spacer; and
    etching said substrate by using said oxide layer as a mask to form a recess in said substrate.

11. The method of claim 10, further comprising forming a pad layer over said substrate and each protrusion.

12. The method of claim 10, wherein said step of ion implanting further comprises providing a nitrogen ion source.

13. The method of claim 10, wherein said protrusion comprises a dielectric isolation region.

14. The method of claim 10, further comprising oxidizing substantially all silicon spacers.

15. The method of claim 10, wherein said substrate further comprises a trench capacitor underneath said protrusion.

16. A method of forming a semiconductor device, comprising:
    providing a substrate including a plurality of protrusions projecting from said substrate;
    forming a silicon layer above said substrate and each protrusion;
    performing an anisotropic etching to transform said silicon layer into a silicon spacer positioned on a side wall of each protrusion;
    forming an oxide layer over said silicon spacer; and
    etching said substrate by using said oxide layer as a mask to form a recess in said substrate.

17. The method of claim 16, further comprising forming a pad layer over said substrate and each protrusion.

18. The method of claim 16, wherein said protrusion comprises a dielectric isolation region.

19. The method of claim 16, further comprising oxidizing substantially all silicon spacers.

20. The method of claim 16, wherein said substrate further comprises a trench capacitor underneath said protrusion.

* * * * *

UNITED STATES PATENT AND TRADEMARK OFFICE
CERTIFICATE OF CORRECTION

PATENT NO.       : 7,659,163 B2
APPLICATION NO. : 11/564929
DATED            : February 9, 2010
INVENTOR(S)      : Wu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 258 days.

Signed and Sealed this

Thirtieth Day of November, 2010

David J. Kappos
*Director of the United States Patent and Trademark Office*